US012562336B2

(12) United States Patent
Virdi et al.

(10) Patent No.: US 12,562,336 B2
(45) Date of Patent: Feb. 24, 2026

(54) METHOD OF IMAGING A SAMPLE WITH A CHARGED PARTICLE BEAM DEVICE, METHOD OF CALIBRATING A CHARGED PARTICLE BEAM DEVICE, AND CHARGED PARTICLE BEAM DEVICE

(71) Applicants: Applied Materials, Inc., Santa Clara, CA (US); Kulpreet Singh Virdi, Munich (DE); Bernhard G. Mueller, Finsing (DE); Bernhard Schüler, Munich (DE)

(72) Inventors: Kulpreet Singh Virdi, Munich (DE); Bernhard G. Mueller, Finsing (DE); Bernhard Schüler, Munich (DE)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 18/015,581

(22) PCT Filed: Jul. 29, 2020

(86) PCT No.: PCT/EP2020/071418
§ 371 (c)(1),
(2) Date: Jan. 11, 2023

(87) PCT Pub. No.: WO2022/022819
PCT Pub. Date: Feb. 3, 2022

(65) Prior Publication Data
US 2023/0253177 A1      Aug. 10, 2023

(51) Int. Cl.
*H01J 37/21*          (2006.01)
*H01J 37/14*          (2006.01)
(Continued)

(52) U.S. Cl.
CPC .............. *H01J 37/21* (2013.01); *H01J 37/14* (2013.01); *H01J 37/1474* (2013.01);
(Continued)

(58) Field of Classification Search
CPC ........ H01J 37/14; H01J 37/1474; H01J 37/21; H01J 37/265; H01J 37/28; H01J 2237/2826; H01J 2237/216; H01J 2237/20228
See application file for complete search history.

(56) References Cited

U.S. PATENT DOCUMENTS

2006/0060781 A1      3/2006   Watanabe et al.
2006/0219908 A1*   10/2006   Inada .................... H01J 37/222
                                                                    250/310
(Continued)

FOREIGN PATENT DOCUMENTS

JP          2002-015691  A        1/2002
JP          2006286578  A       10/2006

OTHER PUBLICATIONS

International Search Report and Written Opinion, PCT/EP2020/071418, May 19, 2021.
(Continued)

*Primary Examiner* — David E Smith
(74) *Attorney, Agent, or Firm* — Patterson + Sheridan, LLP

(57)          ABSTRACT

A method of imaging a sample with a charged particle beam device, comprising: determining a first focusing strength of an objective lens of the charged particle beam device, the first focusing strength being adapted to focus a charged particle beam on a first surface region of the sample; determining a first focal subrange of a plurality of focal subranges such that the first focusing strength is within the first focal subrange, wherein the plurality of focal subranges
(Continued)

is associated with a set of values of a calibration parameter; determining a first value of the calibration parameter, the first value being associated with the first focal subrange; and imaging the first surface region with the first value.

19 Claims, 7 Drawing Sheets

(51) Int. Cl.
  *H01J 37/147*            (2006.01)
  *H01J 37/28*             (2006.01)
(52) U.S. Cl.
  CPC ..... *H01J 37/28* (2013.01); *H01J 2237/20228* (2013.01); *H01J 2237/216* (2013.01); *H01J 2237/2826* (2013.01)

(56)                    References Cited

U.S. PATENT DOCUMENTS

| | | | |
|---|---|---|---|
| 2015/0012243 A1* | 1/2015 | Honda ................ | G03F 7/70641 |
| | | | 702/155 |
| 2019/0113470 A1* | 4/2019 | Mueller ................. | H01J 37/21 |

OTHER PUBLICATIONS

Notice of Allowance in related application KR 10-2023-7006711 dated May 8, 2025.

* cited by examiner

FIG. 6

METHOD OF IMAGING A SAMPLE WITH A CHARGED PARTICLE BEAM DEVICE, METHOD OF CALIBRATING A CHARGED PARTICLE BEAM DEVICE, AND CHARGED PARTICLE BEAM DEVICE

FIELD

The present disclosure relates to a method of imaging a sample with a charged particle beam device. In particular, a large-area substrate for display manufacturing which may have a non-planar surface is imaged. More particularly, embodiments described herein relate to methods and apparatuses for imaging samples with a focused charged particle beam, particularly for at least one of metrology, reviewing and inspecting defects. In particular, embodiments described herein may be used for imaging samples for performing measurements such as critical dimension measurements. Further, a method of calibrating a charged particle beam device and a charged particle beam device for imaging a sample are described.

BACKGROUND

In many applications, thin layers are deposited on a substrate, e.g. on a glass substrate. The substrate is typically coated in a vacuum chamber of a coating apparatus. For some applications, the substrate is coated in a vacuum chamber using a vapor deposition technique. Over the last few years, the price of electronic devices and particularly optoelectronic devices has reduced significantly. Further, the pixel density in displays has increased. For TFT displays, a high density TFT integration is beneficial. In spite of the increased number of thin-film transistors (TFT) within a device, the yield is to be increased and the manufacturing costs are to be reduced further.

One or more structures or layers may be deposited on a substrate such as a glass substrate to form an array of electronic or optoelectronic devices such as TFTs on the substrate. A substrate with electronic or optoelectronic structures formed thereon is also referred to as a "sample" herein. During the manufacturing of TFT-displays and other samples, it may be beneficial to image one or more structures deposited on the sample to monitor the quality of the sample.

Imaging of the sample can, for example, be carried out by an optical system. However, features of the sample, e.g. edges of a thin, lithographically defined line, may appear blurred or broadened in the optical system or may not be resolvable as individual features. Accordingly, optical systems may not be suited for imaging some features of the sample. Charged particles such as electrons may be utilized for imaging the surface of the sample. Charged particles may provide a better resolution as compared to optical systems and/or a more accurate identification of features such as edges of lithographically defined structures.

However, imaging of samples with non-planar surfaces or samples lying on a non-planar substrate holder with a charged particle beam may be challenging, because the sample surface may not be located at a calibrated distance from the objective lens, and the depth of field of a charged particle beam device is limited. Refocusing the charged particle beam onto the sample surface may introduce measurement errors, whereas moving the sample surface into the focus of the charged particle beam by a stage movement may slow down the imaging of surface regions of the sample.

Accordingly, given the increasing demand for an increased quality of displays on large area substrates, there is a need for an improved method for investigating samples with a high measurement accuracy and in a quick and reliable manner. In particular, there is a need for process control for large-area samples with a high or predetermined measurement accuracy, e.g. when conducting critical dimension measurements.

SUMMARY

According to aspects of the disclosure, methods of imaging a sample with a charged particle beam device, methods of calibrating a charged particle beam device as well as charged particle beam devices for imaging samples are provided. Further aspects, benefits, and features of the present disclosure are apparent from the claims, the description, and the accompanying drawings.

According to one aspect, a method of imaging a sample with a charged particle beam device is provided. The method includes determining a first focusing strength of an objective lens of the charged particle beam device, the first focusing strength being adapted to focus a charged particle beam on a first surface region of the sample; determining a first focal subrange of a plurality of focal subranges such that the first focusing strength is within the first focal subrange, wherein the plurality of focal subranges is associated with a set of values of a calibration parameter; determining a first value of the calibration parameter, the first value being associated with the first focal subrange; and imaging the first surface region with the first value.

According to another aspect, a method of calibrating a charged particle beam device is provided. The method includes performing first measurements by performing a first measurement of a calibration object for each of a first plurality of focusing strengths; determining measurement errors by determining a measurement error for each of the first plurality of focusing strengths based on the first measurements; determining a plurality of focal subranges based on the measurement errors and a measurement accuracy; performing second measurements by performing a second measurement of the calibration object for each of the plurality of focal subranges; and determining a set of values of a calibration parameter for the plurality of focal subranges based on the second measurements.

According to a further aspect, a charged particle beam device for imaging a sample is provided. The charged particle beam device includes a stage for arranging the sample to be imaged; an objective lens configured to focus a charged particle beam propagating along an optical axis; and a computer-readable medium containing a program for imaging the sample, which, when executed by a processor, performs a method according to embodiments described herein.

Further aspects, advantages and features of the present disclosure are apparent from the description and the accompanying drawings.

BRIEF DESCRIPTION OF THE DRAWINGS

A full and enabling disclosure to one of ordinary skill in the art is set forth in the remainder of the specification including reference to the accompanying drawings wherein:

FIG. 6 is a schematic illustration of a graph relating an orientation mismatch of a scan rotation to a second plurality of focusing strengths;

DETAILED DESCRIPTION

Figure 1:
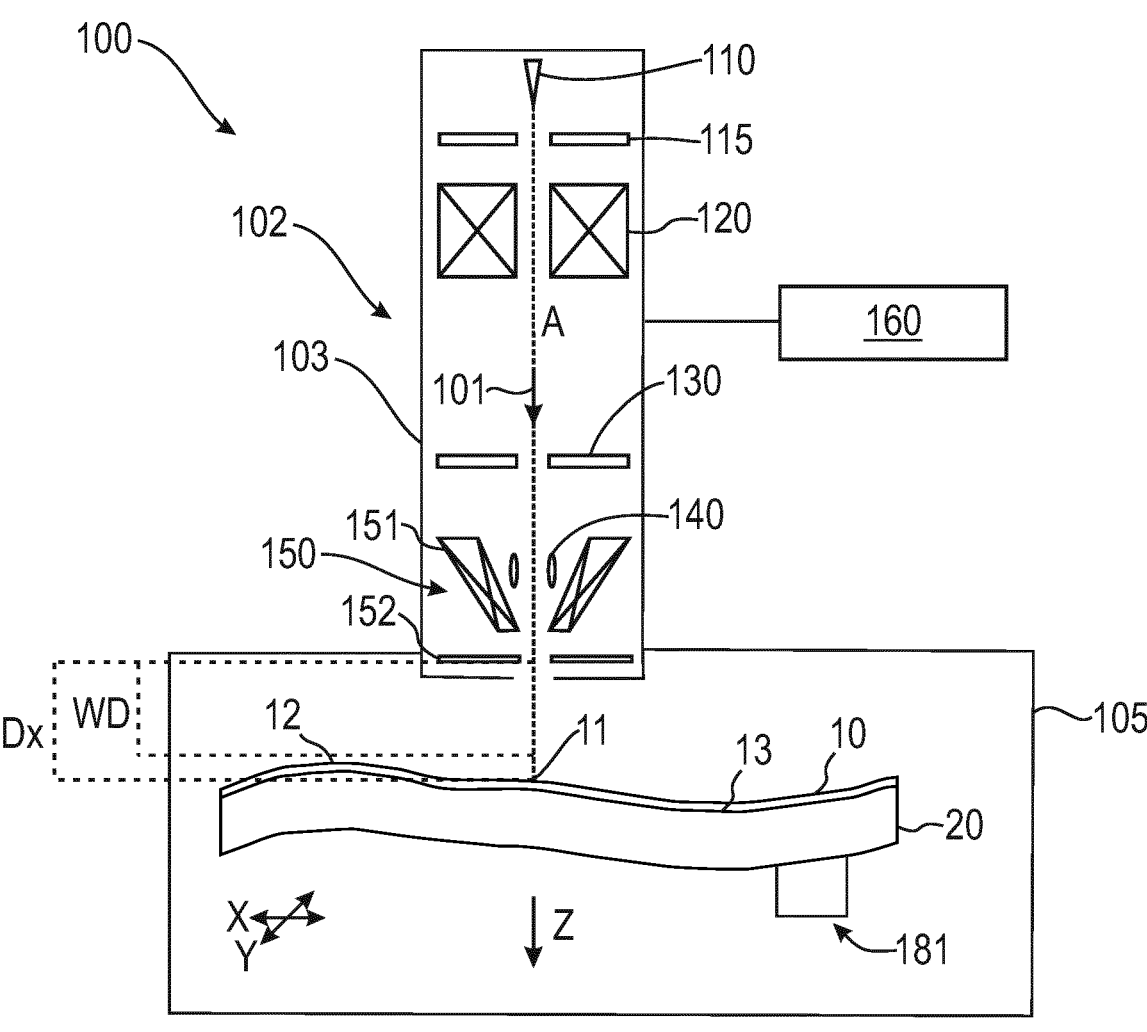
FIG. 1 shows a charged particle beam device configured to be operated according to methods described herein.

Reference will now be made in detail to exemplary embodiments, one or more examples of which are illustrated in the figures. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, same reference numbers refer to same components. Only the differences with respect to the individual embodiments are described. The structures shown in the drawings are not necessarily depicted true to scale but rather serve the better understanding of the embodiments.

FIG. 1 shows a charged particle beam device 100 configured to be operated according to methods described herein. The charged particle beam device 100 may include a scanning electron microscope 102 with a beam source 110 configured to generate a charged particle beam 101, particularly an electron beam. The charged particle beam 101 can be directed along an optical axis A through a column 103 of the scanning electron microscope 102. An inner volume of the column 103 can be evacuated. The scanning electron microscope 102 may include beam influencing elements such as one or more beam deflectors, scan deflectors 140, accelerators 115, decelerators, lens elements 120 or other focusing or defocusing elements, beam correctors, beam separators, detectors and/or further elements provided for influencing the charged particle beam 101 propagating along the optical axis A.

The charged particle beam device 100 includes a stage 20 for arranging a sample 10 to be imaged thereon, and an objective lens 150 configured to focus the charged particle beam on the sample 10 arranged on the stage 20.

The stage 20 may be arranged in a sample imaging chamber 105 which can be evacuated in some embodiments. In some embodiments, the stage 20 may be a movable stage. In particular, the stage 20 may be movable in a plane perpendicular to the optical axis A of the charged particle beam device 100 (also referred to herein as X-Y-plane). By moving the stage 20 in the X-Y-plane or along X-Y-axes of the charged particle beam device 100, a specified surface region of the sample 10 is moved into an area below the scanning electron microscope 102, such that the specified surface region can be imaged by focusing the charged particle beam 101 thereon. For example, in FIG. 1, a first surface region 11 of the sample 10 is intersected by the optical axis A of the scanning electron microscope 102 such that the first surface region 11 can be imaged. The stage 20 may also be movable in the Z-direction, i.e. in the direction of the optical axis A. In embodiments, the stage 20 may be movable in the X-Y-plane and in the Z-direction by a stage motion controller 181.

According to embodiments described herein, one or more surface regions of the sample 10 may be imaged with the charged particle beam device 100. The term "sample" as used herein may relate to a substrate with one or more layers or features formed thereon. The sample may be imaged for one or more of (i) performing metrology, particularly for measuring dimensions of one or more features of the sample, e.g. in a lateral direction, i.e. in the X-Y-plane, more particularly performing critical dimension measurements, (ii) detecting defects, and/or (iii) investigating or inspecting the quality of the sample.

In some embodiments, a surface of the sample to be imaged may be a non-planar surface. For example, the sample surface may be rough, uneven or may include 3-dimensional features or structures having a varying height formed thereon. Different surface regions of the sample may be positioned at different levels relative to a plane of the objective lens.

In some embodiments, the sample (which may have a planar or a non-planar sample surface) may be arranged on the stage 20, wherein the stage 20 has a non-planar stage surface 13. For example, a non-planar stage surface 13 may have stage surface regions at different levels relative to a plane of the objective lens 150. Differences between the levels of the stage surface regions may be for example a few hundreds of micrometers large. Accordingly, when the sample 10 is arranged on the non-planar stage surface 13, the sample 10 can have a first surface region 11 and a second surface region 12 which are arranged at different levels. The "level" of a surface region of a sample that is arranged on the stage may refer to a distance along the optical axis A or in a Z-direction of the surface region relative to a plane of the objective lens 150. As is schematically depicted in FIG. 1, the sample 10 may be arranged on a non-planar stage surface 13 of the stage 20. The sample 10 may include a first surface region 11 that is provided at a first level and a second surface region 12 laterally spaced from the first surface region 11 that is provided at a second level. In other words, the distance of the first surface region 11 relative to the plane of the objective lens 150, particularly the distance in the Z-direction, differs from the distance of the second surface region 12 relative to the plane of the objective lens 150.

For imaging a sample with the charged particle beam 101, the charged particle beam is typically focused on the sample surface with the objective lens 150. Secondary electrons or backscattered electrons (also referred to as "signal electrons") are generated when the charged particle beam 101 impinges on the sample surface. The signal electrons provide information on spatial characteristics and dimensions of features of the sample surface and are detected with a detector 130. By scanning the charged particle beam 101 over the sample surface, e.g. with scan deflectors 140, and detecting the signal electrons as a function of generation position of the signal electrons, the sample surface or a portion thereof can be imaged.

In some embodiments, one or more scan deflectors 140 may be provided for scanning the charged particle beam 101 over the surface of the sample, e.g. in the X-direction and/or in the Y-direction.

The charged particle beam can be focused to a small spot on the sample surface. Focusing the charged particle beam to a small spot can increase the obtainable image resolution. Accordingly, the sample surface should be arranged in the plane of focus of the objective lens during imaging. The distance between the downstream end of the objective lens 150 and the plane of focus of the charged particle beam where the sample surface is to be arranged is typically referred to as the working distance WD of the charged particle beam device 100.

Imaging a non-planar sample surface with a charged particle beam may be challenging because not all surface regions lie within a common plane of focus. For example, the first surface region 11 and the second surface region 12 in FIG. 1 lie in different planes of focus. Surface regions located at varying distance from the objective lens can be sharply imaged by locally adapting the focusing strength of the objective lens or by moving the stage along the optical axis A such that the sample surface is brought into focus. The focusing strength of the objective lens may be adapted depending on a local height of the surface region to be imaged. For example, the objective lens may include a magnetic lens component 151 with one or more coils. The focusing strength of the objective lens may be increased by increasing a focusing current which is applied to the one or more coils of the magnetic lens component 151 (decreasing the focusing distance), and the focusing strength of the objective lens may be decreased by decreasing the focusing current applied to the one or more coils (increasing the focusing distance). The focusing distance may be understood as the distance between the downstream end of the objective lens and the plane of focus when exciting the objective lens 150 with an associated focusing current.

Figure 2:
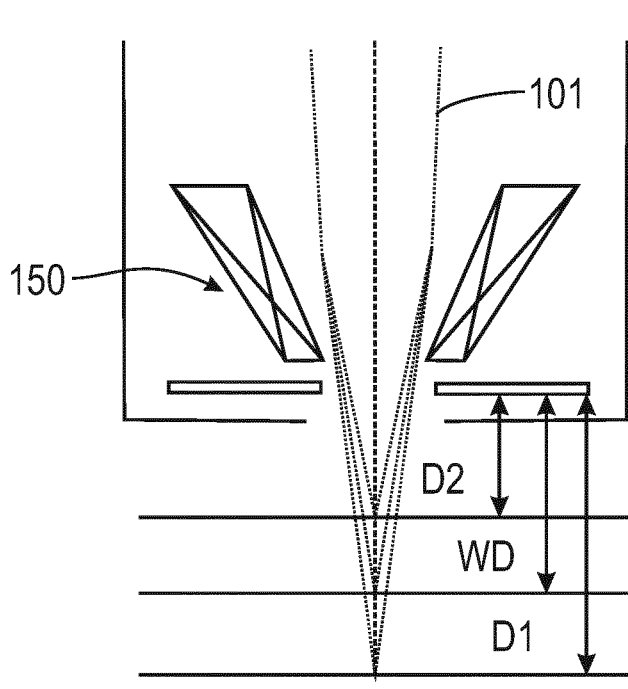
FIG. 2 shows a schematic view of an objective lens for illustrating the dependency of the focusing distance on the focusing strength.

FIG. 2 illustrates an objective lens 150 and a charged particle beam 101 for three different focusing strengths. For each of the three different focusing strengths, the charged particle beam 101 is focused at a different focusing distance from the objective lens 150, particularly at a working distance WD, at a first distance D1 or at a second distance D2. By adjusting the focusing strength of the objective lens 150, particularly a focusing current, the plane of focus can be shifted toward or away from the objective lens 150. Samples having a varying surface level can be sharply imaged by locally adjusting the focusing strength of the objective lens 150. In other words, when an uneven sample surface or a sample that is arranged on a non-planar stage is to be imaged, the focusing strength of the objective lens 150 may be changed depending on the level of the surface region to be imaged.

A change of the focusing strength of the objective lens 150 for focusing the charged particle beam 101 on a surface region of the sample 10 can lead to a change in the pixel size (nm/pixel), e.g. in acquired images. As shown for example in FIG. 3A, a feature 310 on a sample surface 308 of a sample may be positioned at a working distance WD from the objective lens 150. The scan deflectors 140 may deflect the electron beam with a first deflection 342 such that the feature 310 is observed in a first field of view 312 of an image scan of the charged particle beam 101. For example, the charged particle beam 101 may be calibrated for measurements at the working distance WD. In particular, a pixel in an acquired image may be correlated to a dimension on the sample surface 308, e.g. a length on the sample surface

308. Accordingly, the correlation between the scan current of the scan deflectors 140 and the first field of view 312 is known and the actual dimension of the feature 310 can be determined from an acquired image of the sample surface 308.

Figure 3A:
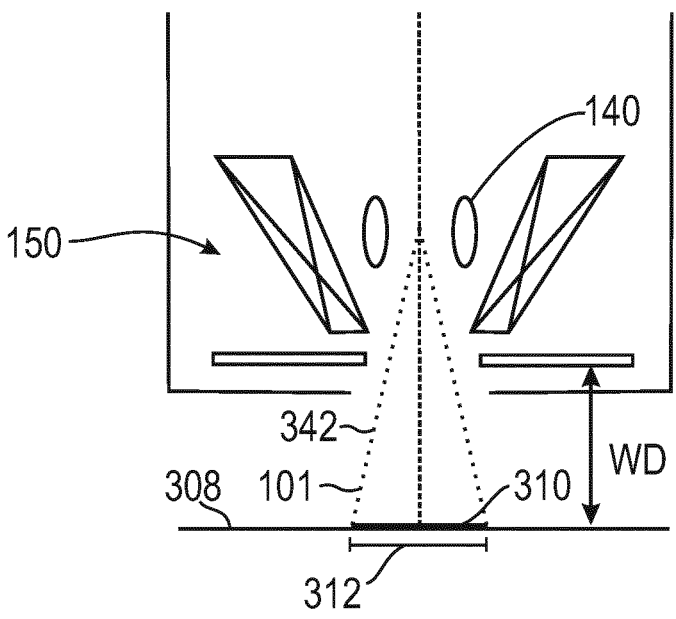
FIGS. 3A and 3B illustrate the dependency of the field of view on the distance between a sample surface and an objective lens of a charged particle beam device.
Figure 3B:
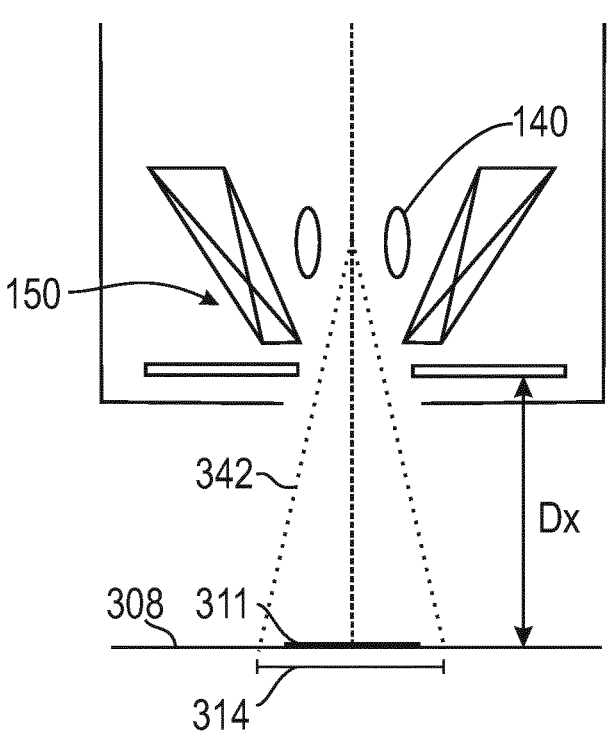

In FIG. 3B, the sample is positioned for imaging a different surface region of the sample surface 308. A further feature 311 of the same size as the feature 310 is positioned at an unknown distance Dx from the objective lens 150. The charged particle beam 101 can be focused onto the sample surface 308. Scanning the sample surface 308 with the first deflection 342 can result in the observation of a second field of view 314 on the sample surface 308, which may be different from the first field of view 312. For example, in FIG. 3B the second field of view 314 is larger than the first field of view 312 shown in FIG. 3A, particularly due to the unknown distance Dx of FIG. 3B being larger than the working distance WD in FIG. 3A. Accordingly, the further feature 311 of the sample 10 appears smaller in the second field of view 314 (FIG. 3B) than the feature 310 in the first field of view 312 (FIG. 3A). In particular, a dimension or a critical dimension of the further feature 311 may appear smaller than an actual dimension of the further feature 311. Similarly, when a distance between a surface region of the sample and the objective lens is smaller than a predetermined working distance, e.g. the working distance WD, a feature of the sample appears bigger than the actual dimension of the feature. Measuring a dimension of a feature positioned at a distance different from the predetermined working distance according to conventional techniques can negatively impact the accuracy of the measurement.

In this context, it is noted that for a charged particle beam with a high landing energy on the sample, measurement errors may be comparably low. However, when using a charged particle beam with a low landing energy, measurement errors may become significant, e.g. in case of an electron beam with a landing energy of 5 keV or less, particularly with a landing energy of 1 keV or less. Accordingly, measurement errors may become significant in the case of a charged particle beam device including a low voltage SEM (LV-SEM).

Low energy electron beams are beneficial for the imaging of glass samples or other non-conductive samples. However, low-energy electron beams are more sensitive to variations of a distance between the sample surface and the objective lens. Conventional methods of imaging a non-planar sample or a sample on a non-planar stage cannot provide a level of accuracy or throughput as appropriate for performing metrology, review or inspection of large area substrates such as glass substrates as used for the manufacture of flat panel and/or TFT based displays.

According to methods and apparatus described herein, a charged particle beam device may be calibrated for imaging a sample, particularly for imaging a sample surface with a predetermined measurement accuracy.

According to embodiments, a method of calibrating a charged particle beam device is provided. The method can include arranging a calibration sample on a stage of a charged particle device. The calibration sample may have a calibration object on a surface of the calibration sample. The calibration object can have a known dimension. For example, the calibration object may include lines positioned at known distances or at a known pitch. The lines may be formed by a lithographic process. The calibration sample may particularly be a calibration standard. For example, a calibration standard may be provided by an institute of standards.

In some embodiments, the method may include defining a measurement accuracy for the charged particle beam device. The measurement accuracy may be dependent e.g. on process limitations and/or on an inaccuracy level that is acceptable for a measurement. The measurement accuracy may be provided as an accuracy in a dimension, e.g. an accuracy of a length measurement in an image of a surface region. For example, the measurement accuracy may be provided as a length measurement accuracy, e.g. in nanometers. In embodiments, the measurement accuracy may be smaller than 20 nm, particularly smaller than 10 nm, more particularly smaller than 5 nm, smaller than 2 nm or smaller than 0.5 nm. Herein, the measurement accuracy determined for calibrating the charged particle beam device may also be referred to as predetermined measurement accuracy.

In embodiments, the method may include defining an operating point for the column 103 of the charged particle beam device 100. The operating point may include at least one operating point setting, particularly at least one of an acceleration energy, a landing energy, a current of a magnetic lens element, a scan deflector current, a stigmator current and a demagnification of the electron beam from the beam source 110 (electron gun) to the calibration sample. In particular, the operating point may include an operating point setting for the landing energy such that the charged particle beam is provided with a landing energy of 5 keV or less, particularly 1 keV or less. Defining the operating point may include positioning the calibration sample at a working distance WD from the objective lens 150, in particular at a nominal value of a working distance. The charged particle beam may be focused on a calibration sample surface region containing a calibration object. The charged particle beam may be focused on the calibration sample surface region using an operating point focusing strength.

In embodiments, defining the operating point may include determining an operating point calibration value of a calibration parameter, in particular of a deflector parameter. In some embodiments, defining the operating point may include determining a scan rotation such that X-Y axes of the calibration sample or the calibration object are aligned with X-Y axes of an image scan of the charged particle beam device for the operating point. For example, a scan rotation may be determined such that a scan direction of the charged particle beam is at least essentially perpendicular to a longitudinal axis of a calibration object, e.g. a line of the calibration sample.

Figure 4:
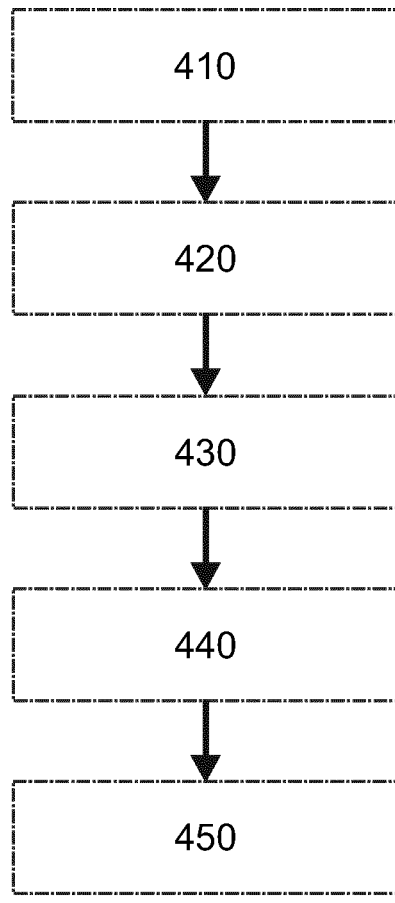
FIG. 4 is a flow diagram illustrating a method of calibrating a charged particle beam device according to embodiments described herein.

FIG. 4 shows a flow diagram for illustrating a method of calibrating a charged particle beam device according to embodiments of the present disclosure. In embodiments, the method includes performing (box 410) first measurements by performing a first measurement of a calibration object for each of a first plurality of focusing strengths. The first plurality of focusing strengths may be selected over a range of focusing strengths with a corresponding range of focusing distances, for example such that the range of focusing distances spans hundreds of micrometers, e.g. at least 100 μm, particularly at least 200 μm or at least 300 μm.

In some embodiments, the first plurality of focusing strengths may be equally spaced within the range of focusing strengths. The range of focusing strengths may contain an operating point focusing strength. In particular, the range of focusing strengths may include at least one focusing strength smaller than the operating point focusing strength and/or at least one focusing strength larger than the operating point focusing strength.

Figure 5A:
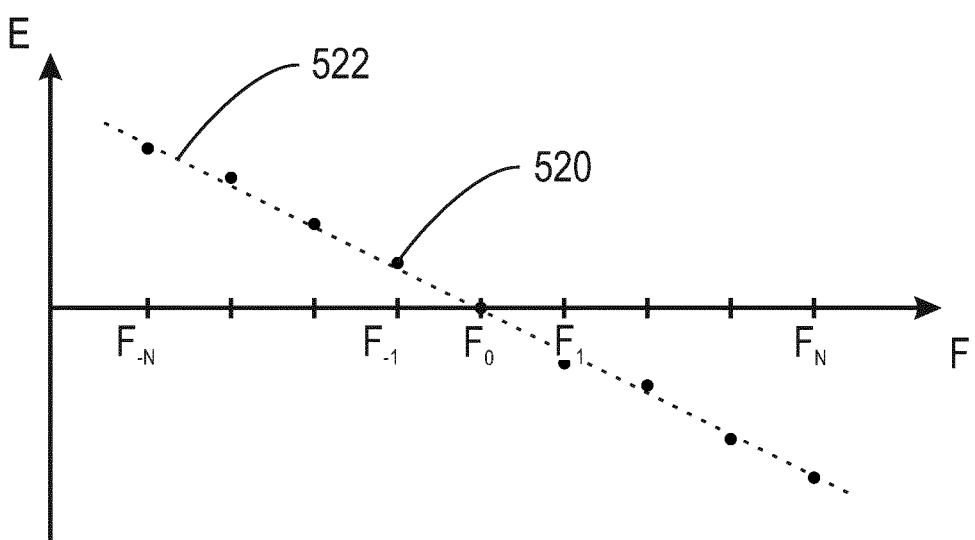
FIG. 5A is a schematic illustration of a graph relating measurement errors to a first plurality of focusing strengths of the objective lens.

As shown for example in FIG. 5A, a first plurality of focusing strengths $F_{-N}, \ldots, F_{-1}, F_0, F_1, \ldots, F_N$ may include an operating point focusing strength $F_0$. In FIG. 5A, the first plurality of focusing strengths $F_{-N}, \ldots, F_{-1}, F_0, F_1, \ldots, F_N$ are determined by addition of a multiple, particularly an integer $(-N, N)$ multiple, of a focusing strength difference R to the operating point focusing strength $F_0$. For example, the first plurality of focusing strengths $F_{-N}, \ldots, F_{-1}, F_0, F_1, \ldots, F_N$ may be calculated by $F_0-NR, \ldots, F_0-R, F_0, F_0+R, \ldots, F_0+NR$.

In embodiments, the calibration object is brought into focus for each of the plurality of focusing strengths of the objective lens. For example, the stage may be moved along the optical axis downwards until the surface is in focus for the smallest focusing strength $F_{-N}$ of the first plurality of focusing strengths. After performing the first measurement for the smallest focusing strength $F_{-N}$, the stage may be moved upwards to bring the calibration object into focus for a next focusing strength $F_{-N+1}$. The method may proceed with performing the first measurement for each of the first plurality of focusing strengths $F_{-N}, \ldots, F_{-1}, F_0, F_1, \ldots, F_N$.

In some embodiments, the calibration object can be brought into focus manually by an operator of the charged particle beam device. The operator may move the stage along the optical axis to find a stage position providing a sharp image of the calibration object. In some embodiments, the calibration object may be brought into focus using a variable distance autofocusing process. A variable distance autofocusing process can include imaging the calibration object at varying distances from the objective lens and analyzing an image sharpness of obtained images. Optionally, an image contrast may be analyzed. The distance between the objective lens and the calibration object may be varied between obtaining images by moving the stage along the optical axis. In particular, images may be obtained at distances between the calibration object and the objective lens in an iterative convergence process by optimizing the image sharpness. The convergence iterative process may include selecting the distances between the calibration object and the objective lens based on a golden ratio search method or based on a Fibonacci search method.

As used herein, a surface region being in focus or the charged particle beam being focused on a surface region may be understood such that the surface region is at a focal point of the charged particle beam. An image scan of the surface region can provide a sharp image of the surface region. The surface region may be in an optimum focus. For example, the charged particle beam may be focused to a small spot on the surface region. A surface region may particularly be brought into focus manually or by an autofocusing process, e.g. by a variable distance autofocusing process or by a variable focus autofocusing process according to embodiments described herein.

Once the calibration object is brought into focus for a focusing strength of the first plurality of focusing strengths, performing a first measurement may include acquiring an image of the calibration object. Performing the first measurement may include measuring a dimension of the calibration object in the acquired image. In particular, the dimension may be a lateral dimension of the calibration object. The dimension of the calibration object can have a known value. For example, the dimension may be a pitch of lines of the calibration object. The first measurement of the calibration object can be performed for each of the first plurality of focusing strengths.

In embodiments, the method includes determining (box 420) measurement errors by determining a measurement error for each of the first plurality of focusing strengths based on the first measurements. The measurement errors can be determined based on the first measurements and based on a known value of the dimension of the calibration object. For example, a measurement error may be determined for each of the first plurality of focusing strengths as the difference between a respective first measurement of the dimension and the known value of the dimension. The measurement errors 520 may be plotted in a graph of error E against focusing strength F as shown for example in FIG. 5A.

In embodiments, the method includes determining (box 430) a plurality of focal subranges based on the measurement errors and a measurement accuracy, particularly a predetermined measurement accuracy. The measurement accuracy may be defined or provided according to embodiments described herein. Determining the plurality of focal subranges can include fitting a measurement error function to the measurement errors. For example, a measurement error function may be a linear fit. A linear fit may be used under certain conditions. In further embodiments, curves other than a linear fit may be used for fitting the measurement errors. In FIG. 5A, the measurement errors 520 are fitted by a measurement error function 522, in particular by a linear fit.

According to embodiments, the plurality of focal subranges can be determined based on the measurement error function and the measurement accuracy. In some embodiments, the plurality of subranges can be determined such that within each of the plurality of focal subranges an error range spanned by the measurement error function is smaller than or equal to the measurement accuracy. In particular, the error function and multiples of the measurement accuracy may be used to determine a further plurality of focusing strengths Fa, Fb, . . . Fi, Fj, . . . , Fx, Fy. The multiples of the measurement accuracy may particularly include multiples of the measurement accuracy contained in a range spanned by the measurement errors. For example, the further plurality of focusing strengths may be calculated using an inverse function of the measurement error function. In particular, the further plurality of focusing strengths may be calculated by application of the inverse function to the multiples of the measurement accuracy. The plurality of focal subranges may each be determined as a range between two neighboring focusing strengths of the further plurality of focusing strengths.

Figure 5B:
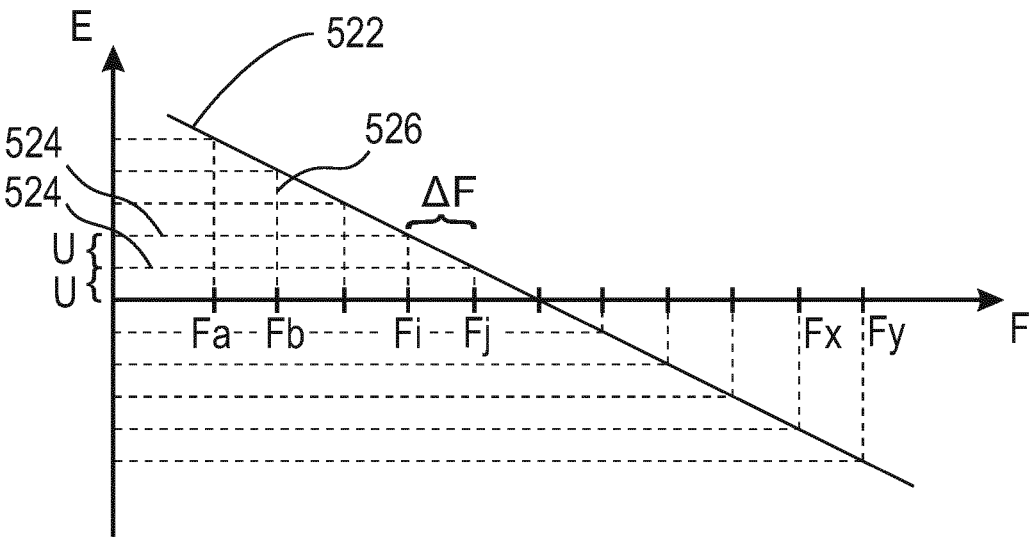
FIG. 5B is a schematic illustration of a graph for determining a plurality of focal subranges.

FIG. 5B illustrates a determination of the plurality of focal subranges according to embodiments described herein. FIG. 5B includes the measurement error function 522 as determined from the measurement errors 520 (FIG. 5A). Horizontal lines 524 may be provided at multiples of the measurement accuracy U along the axis of error E. Vertical lines 526 can be provided at the intersections of the horizontal lines 524 with the measurement error function 522. The intersections of the vertical lines 526 and the axis of focusing strength F can provide the further plurality of focusing strengths Fa, Fb, . . . , Fi, Fj, . . . , Fx, Fy. The plurality of focal subranges may be determined as the ranges between neighboring focusing strengths of the further plurality of focusing strengths Fa, Fb, . . . , Fi, Fj, Fx, Fy along the axis of focusing strength F. For example, the plurality of focal subranges may include the subranges of [Fa,Fb], . . . , [Fi,Fj], . . . , [Fx,Fy]. Within each subrange, errors of measurements can be smaller than the measurement accuracy U. The plurality of focal subranges can each span a subrange width ΔF. Particularly, if the measurement error function 522 is a linear fit, the plurality of focal subranges may have the same subrange width ΔF. In further embodiments, the subrange width may be different for different focal subranges of the plurality focal subranges, particularly if the measurement error function is determined as a curve other than a linear fit.

According to embodiments, the method includes performing (box 440) second measurements by performing a second measurement of the calibration object for each of the plurality of focal subranges. Performing the second measurements can include determining a calibration focusing strength for each of the plurality of focal subranges. For example, the calibration focusing strength may be a central focusing strength or an average focusing strength for each of the plurality of focal subranges. Referring to FIG. 5B, for each of the plurality of focal subranges the calibration focusing strength may be determined for example as (Fa+Fb)/2, . . . , (Fi+Fj)/2, . . . , (Fx+Fy)/2.

In some embodiments, each of the plurality of focal subranges has a calibration focusing strength for performing the second measurement. The objective lens may focus the charged particle beam with a calibration focusing strength of a focal subrange of the plurality of focal subranges. The calibration object can be brought into focus by moving the stage along the optical axis. The calibration object may be brought into focus manually or by using a variable distance autofocusing process according to embodiments described herein.

Once the calibration object is brought into focus, performing the second measurement may include acquiring an image of the calibration object. Performing the second measurement may include measuring a dimension, in particular a lateral dimension, of the calibration object in the acquired image. The dimension, e.g. a pitch of lines of the calibration object, can have a known value. The second measurement of the calibration object can be performed for each of the plurality of focal subranges.

According to embodiments, the method includes determining (box 450) a set of values of a calibration parameter for the plurality of focal subranges based on the second measurements. The set of values may be determined based on the second measurements of a dimension of the calibration object and a known value of the dimension of the calibration object. The set of values can include at least one value associated with each of the plurality of focal subranges. The calibration parameter may be used for imaging a sample, in particular for critical dimension measurements.

In some embodiments, the calibration parameter is a deflector parameter. The deflector parameter can be a parameter for controlling a deflection provided by the scan deflector of the charged particle beam device. In particular, the set of values can include a set of deflector current values and/or a set of deflector voltage values. The set of values may be determined such that a field of view scanned by the charged particle beam using the calibration parameter has the same size for each calibration focusing strength. In particular, the set of values may be determined such that for each calibration focusing strength the field of view has the same size as a reference field of view at the operating point focusing strength. Calibrating the charged particle beam device according to embodiments described herein can enable imaging a sample, particularly performing measurements or critical dimension measurements, with a measurement accuracy, particularly a predetermined measurement accuracy. In particular, measurements with a predetermined measurement accuracy may be provided for any focusing strength within the plurality of focal subranges.

In some embodiments, the plurality of focal subranges, particularly the plurality of focal subranges as a whole, can correspond to a range of focusing distances. The range of focusing distances can span hundreds of micrometers, e.g. at least 100 μm, particularly at least 200 μm or at least 300 μm. Providing a set of values of a calibration parameter according to embodiments can enable accurate measurements over a wide range of focusing distances, in particular for samples such as large-area substrates, samples arranged on a non-planar stage or particularly samples having surface regions positioned at distances from a plane of the objective lens with distances differing by hundreds of micrometers.

According to some embodiments, the method can include determining orientation mismatches by determining an orientation mismatch of a scan rotation of the charged particle beam device with respect to the calibration object for each of a second plurality of focusing strengths. Orientation mismatches at different focusing strengths may originate in different magnetic fields provided at different focusing strengths, in particular at different focusing currents. In particular, magnetic fields may curve the trajectory of charged particles of the charged particle beam such that scan rotations or scan directions of the charged particle beam at different focusing strengths can have orientation mismatches.

In embodiments, for each of the second plurality of focusing strengths the orientation mismatch can be a difference of an orientation of an image scan with respect to a reference image scan performed at a reference focusing strength, particularly at the operating point focusing strength. The orientation mismatch of an image scan can be determined for example as a difference of an orientation, e.g. an angular orientation, of X-Y axes of the image scan with respect to an orientation of X-Y axes of the calibration object. An orientation mismatch can be determined manually or automatically, e.g. using an edge finding algorithm such as a Soebel edge detector.

In some embodiments, the second plurality of focusing strengths can be the same as the first plurality of focusing strengths. In particular, the orientation mismatches may be determined with performing the first measurements of the calibration object for each of a first plurality of focusing strengths, e.g. with box 410 of FIG. 4. For example, for each of the first plurality of focusing strengths, the calibration object may be brought into focus. An orientation mismatch may be determined in a first image of the calibration object. The orientation mismatch can be corrected. A first measurement may be performed in a second image of the calibration object, particularly in a second image acquired after correcting the orientation mismatch. The first measurements may be performed according to embodiments described herein.

In some embodiments, the second plurality of focusing strengths may be different from the first plurality of focusing strengths. The calibration object may be brought into focus for each of the second plurality of focusing strengths, e.g. by moving the stage manually or by using a variable distance autofocusing process. Once the calibration object is in focus for one of the second plurality of focusing strengths, an orientation mismatch may be determined. An orientation mismatch can be determined for each of the second plurality of focusing strengths.

According to embodiments, the method may include determining a relation between a focusing strength and a scan rotation based on the orientation mismatches and the second plurality of focusing strengths. The relation can be for example a function, e.g. an analytical expression, or a table relating the focusing strength and the scan rotation. The relation may be determined by fitting a fit curve to the orientation mismatches as a function of focusing strength. The fit curve may be for example a linear fit curve.

Figure 6:
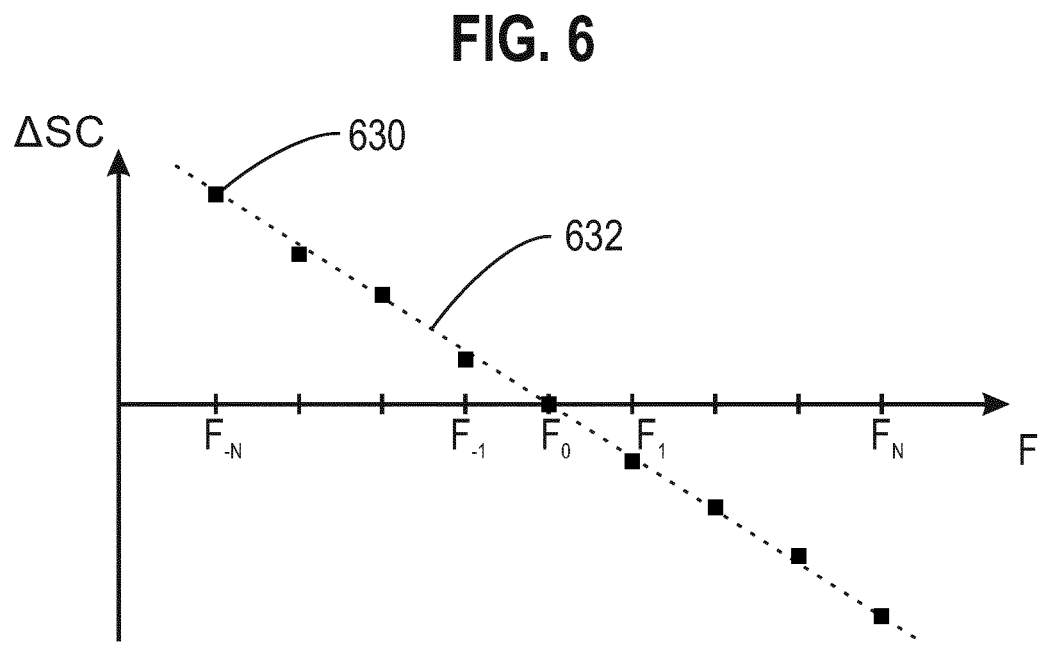

FIG. 6 shows a graph of a scan rotation ΔSC and a focusing strength F. The graph includes orientation mismatches 630 determined for each of the second plurality of focusing strengths. In FIG. 6, the second plurality of focusing strengths corresponds to the first plurality of focusing strengths $F_{-N}, \ldots, F_{-1}, F_0, \ldots, F_N$. A relation between a focusing strength F and a scan rotation ΔSC is determined by fitting the orientation mismatches 630 by a fit curve 632, in FIG. 6 particularly by a linear fit curve. A relation between the focusing strength and the scan rotation may be used to correct a scan rotation of an image scan. The relation between the focusing strength and the scan rotation may be used as a predetermined relation, particularly for imaging a sample according to embodiments described herein. Based on the relation between the focusing strength and the scan rotation, a scan rotation may be corrected before performing a second measurement according to methods of the present disclosure. The relation may be used for imaging a sample according to embodiments described herein, particularly for adjusting a scan rotation parameter.

According to embodiments, which can be combined with other embodiments described herein, a method of imaging a sample with a charged particle beam device is provided. The method may be combined with a method of calibrating the charged particle beam device according to embodiments described herein.

Referring to FIG. 1, the method can include arranging a sample on a stage 20 of the charged particle beam device 100. The sample 10 includes a first surface region 11 that is to be imaged with the charged particle beam device 100. The first surface region 11 is arranged at an unknown distance Dx from the objective lens 150. The first surface region 11 may not be positioned in a plane of focus of the objective lens 150. Further, the first surface region 11 may not be positioned at the predetermined working distance WD from the objective lens 150. In some embodiments, the method can include setting the charged particle beam device to operate at an operating point. The operating point may be defined according to embodiments described herein.

Figure 7:
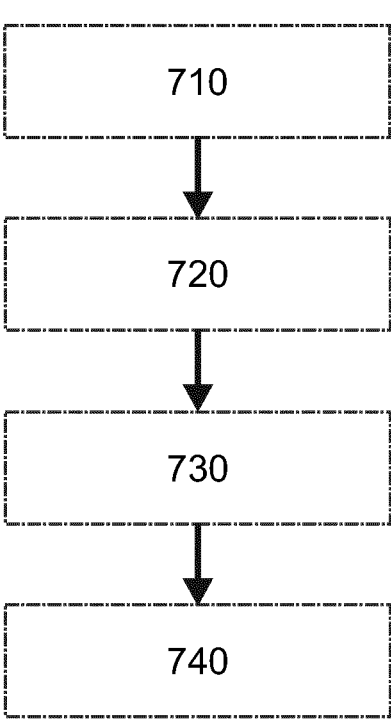
FIG. 7 is a flow diagram illustrating a method of imaging a sample according to embodiments described herein.

FIG. 7 shows a flow diagram for illustrating a method of imaging a sample according to embodiments described herein. According to embodiments, the method includes determining (box 710) a first focusing strength of an objective lens of the charged particle beam device, the first focusing strength being adapted to focus a charged particle beam 101 on a first surface region 11 of the sample 10. In embodiments, the first focusing strength may be determined manually.

In some embodiments, the first focusing strength is determined using a variable focus autofocusing process. The variable focus autofocusing process can include imaging the first surface region 11 with varying focusing strengths of the objective lens 150 and analyzing an image sharpness of obtained images. Optionally, an image contrast may be analyzed. The focusing strength of the objective lens 150 may be varied between obtaining images, e.g. by changing a focusing current of the objective lens. Images may be obtained for various focusing strengths in an iterative convergence process by optimizing the image sharpness. The iterative convergence process may include selecting the varying focusing strengths based on a golden ratio search method or based on a Fibonacci search method.

According to embodiments, the method includes determining (box 720) a first focal subrange of a plurality of focal subranges such that the first focusing strength is within the first focal subrange, wherein the plurality of focal subranges is associated with a set of values of a calibration parameter. The plurality of focal subranges, in particular a predetermined plurality of focal subranges, may be determined before imaging a sample. In particular, the plurality of focal subranges may be determined by calibrating the charged particle beam device according to embodiments described herein.

In some embodiments, each of the plurality of focal subranges may have a calibration focusing strength. The set of values may provide a deflection of the charged particle beam such that a field of view has the same size for each calibration focusing strength. In some embodiments, the calibration parameter is a deflector parameter. In particular, the set of values can include a set of deflector current values and/or a set of deflector voltage values.

According to embodiments, the method includes determining (box 730) a first value of the calibration parameter, the first value being associated with the first focal subrange. For example, the first value may be a first deflector current value or a first deflector voltage value. The first value may provide deflection of the charged particle beam such that for any focusing strength within the first focal subrange imaging of the sample can be performed with a predetermined measurement accuracy.

In embodiments, the method includes imaging (box 740) the first surface region with the first value. The first surface region is imaged, e.g. by performing one or more of: metrology, defect review and inspection of features of the sample, and/or measurements, such as critical dimension measurements.

Figure 3C:
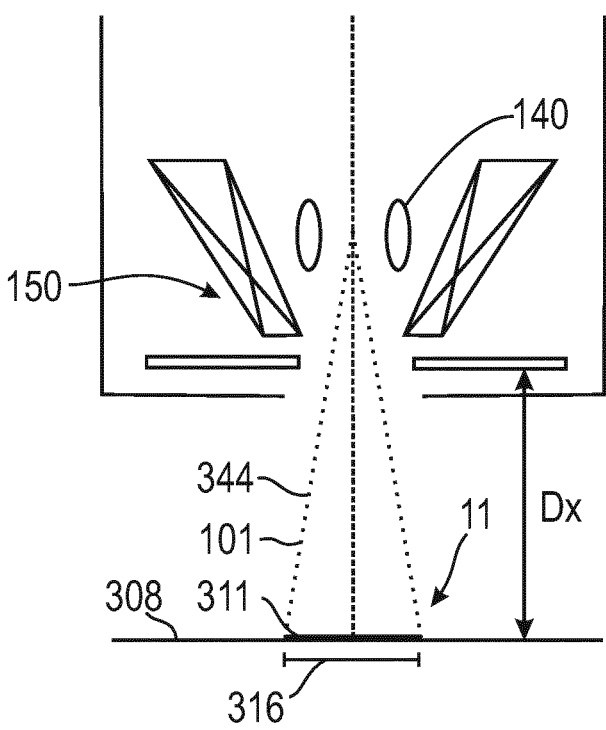
FIG. 3C illustrates imaging a sample according to embodiments described herein.

Referring to FIG. 3C, embodiments of a method of imaging a sample may be illustrated. In FIG. 3C, a first surface region 11 of a sample surface 308 is positioned along the optical axis of the charged particle beam device. The sample surface 308 can have a further feature 311 positioned in the first surface region 11. The first surface region 11 is positioned at an unknown distance Dx from the objective lens 150. The charged particle beam 101 is focused onto the first surface region 11 using a first focusing strength. The first focusing strength can be determined using a variable focus autofocusing process according to embodiments described herein. From a plurality of focal subranges, a first focal subrange containing the first focusing strength is determined. A first value of a set of values of a calibration parameter is determined, wherein the first value is associated with the first focal subrange. For example, in FIG. 3C the calibration parameter can be a deflector parameter and the first value can be a first deflector current value for the scan deflectors 140. The first value can provide a second deflection 344 of the charged particle beam 101 such that a calibrated field of view 316 is scanned by the charged particle beam 101. The first surface region 11 can be imaged, e.g. by acquiring an image of the calibrated field of view 316. The image may be used e.g. for performing critical dimension measurements of the further feature 311. The calibrated field of view 316 can have at least essentially the same size as a first field of view 312 of a sample surface 308 positioned at the working distance WD, as shown e.g. in FIG. 3A. "At least essentially the same size" may be understood such that a nm/pixel pixel size of the image acquired is such that measurements performed would have an inaccuracy within the predetermined measurement accuracy in an image of the calibrated field of view 316.

In some embodiments, imaging the first surface region can include acquiring a first image of the first surface region with the first value of the set of values. The first value may be used to control a deflection of the charged particle beam during an image scan for obtaining the first image. The method can include measuring a dimension of a first object in the first image. In particular, the dimension may be a lateral dimension of the first object. For example, the dimension may be a critical dimension of the first object. The dimension can be measured with a predetermined measurement accuracy.

Embodiments of the present disclosure can enable accurate measurements in a fast and reliable manner. In particular, embodiments can provide the advantage that measurements, for example critical dimension measurements, can be performed with a predetermined measurement accuracy in surface regions of the sample, wherein the surface regions are positioned at different distances from a plane of the objective lens. More specifically, a specification of nm/pixel can be maintained for focusing strengths of the plurality of focal subranges, particularly without a measurement error exceeding the predetermined measurement accuracy. Imaging a sample, particularly for performing accurate measurements, using a variable focus autofocusing process can increase the throughput of metrology, sample review or sample inspection.

According to some embodiments, the method can include adjusting a scan rotation parameter of the charged particle beam device based on the first focusing strength and based on a predetermined relation between a focusing strength and a scan rotation. The predetermined relation between the focusing strength and the scan rotation, herein also referred to as relation between a focusing strength and a scan rotation, can be determined by calibrating the charged particle beam device according to embodiments described herein. Adjusting the scan rotation parameter can be performed before imaging the first surface region with the first value. Adjusting the scan rotation parameter can increase the consistency and/or accuracy of measurements. For example, measurements can be performed in images of different surface regions of the sample such that in each image a scan direction is perpendicular to a longitudinal direction of features on the sample surface.

According to embodiments, which may be combined with other embodiments described herein, the method may include subsequently imaging a plurality of surface regions of the sample 10. For example, the first surface region 11 of the sample 10 of FIG. 1 is imaged first, and the second surface region 12 of the sample 10 that is positioned at a different level or height is imaged afterwards. The surface profile of the sample or of a non-planar stage surface 13 may not be previously known such that after imaging the first surface region 11, a second focusing strength may be determined for focusing the charged particle beam 101 on the second surface region 12 of the sample 10. The method may proceed for the second surface region 12 and/or each of the plurality of surface regions as for the first surface region 11 according to embodiments described herein.

In some embodiments of the present disclosure, which can be combined with other embodiments, the charged particle beam is provided with a landing energy of 5 keV or less, particularly 1 keV or less. In particular, the charged particle beam 101 impinges on the sample with the landing energy. Referring to FIG. 1, the objective lens 150 may include a retarding field component 152 configured to decelerate the charged particle beam 101 to a landing energy of 5 keV or less. The retarding field component 152 may include a retarding electrode. In particular, the charged particle beam device 100 may include a low voltage SEM (LV-SEM). Low energy charged particle beams, particularly low-energy electron beams, do not penetrate deeply into the sample and may therefore provide superior high-quality information about the features on the sample surface. In particular, an advantage of having a landing energy of 5 keV or below, particularly a landing energy of 1 keV or below, is that the electron beam impinging onto the sample generates negligible beam-induced damage and charging compared to high-energy electron beams.

In some embodiments, which can be combined with other embodiments, methods of imaging a sample and/or methods of calibrating a charged particle device may be partially or entirely automated. In particular, automated calibration and/or imaging may provide a high throughput and/or reduce costs. According to the present disclosure, imaging for metrology, review and/or sample inspection may be performed on a part of the sample surface, e.g. based on a sampling over the sample surface.

In some embodiments, the charged particle beam device is configured for imaging a sample, the sample including a large-area substrate for display manufacturing having a surface area of 1 m$^2$ or more. The surface area may be from about 1.375 m$^2$ (1100 mm×1250 mm—GEN 5) to about 9 m$^2$, more specifically from about 2 m$^2$ to about 9 m$^2$ or even up to 12 m$^2$. For instance, a substrate can be GEN 7.5, which corresponds to a surface area of about 4.39 m$^2$ (1.95 m×2.25 m), GEN 8.5, which corresponds to a surface area of about 5.7 m$^2$ (2.2 m×2.5 m), or even GEN 10, which corresponds to a surface area of about 9 m$^2$ (2.88 m×3130 m). Even larger generations such as GEN 11 and GEN 12 can be implemented.

The sample may include an inflexible substrate, e.g., a glass substrate or a glass plate, or a flexible substrate, such as a web or a foil or a thin glass sheet. The sample may be a coated substrate, wherein one or more thin material layers or other features are deposited on the substrate, for example by a physical vapor deposition (PVD) process or a chemical vapor deposition process (CVD) or a lithographic process or an etch process. In particular, the sample may be a substrate for display manufacturing having a plurality of electronic or optoelectronic devices formed thereon. The electronic or optoelectronic devices formed on the substrate are typically thin film devices including a stack of thin layers. For example, the sample may be a substrate with an array of thin film transistors (TFTs) formed thereon, e.g. a thin film transistor based substrate.

Embodiments described herein particularly relate to the imaging of a sample, wherein the sample includes a structure formed on a substrate. In some embodiments, the structure may be formed by lithography and/or etching. The structure may include electronic or optoelectronic devices such as transistors, particularly thin film transistors. The sample may include a large area substrate, particularly a large area substrate for display manufacturing, e.g. having a surface area of 1 m$^2$ or more.

According to embodiments of the present disclosure, a charged particle beam device 100 for imaging a sample 10 includes a stage 20 for arranging a sample 10 to be imaged or a calibration sample. The charged particle beam device 100 includes an objective lens 150 configured to focus a charged particle beam 101 propagating along an optical axis A. The charged particle beam device 100 includes a computer-readable medium containing a program for imaging the sample, which, when executed by a processor, performs a method according to embodiments described herein, particularly a method of imaging the sample. In some embodiments, the computer-readable medium contains a further program for calibrating the charged particle beam device, which, when executed by the processor, performs a method of calibrating the charged particle beam device 100 according to embodiments described herein.

In some embodiments, the charged particle beam device includes a controller 160, the controller 160 being connected to the charged particle beam device 100. The controller 160 of the charged particle beam device 100 may include a central processing unit (CPU), the computer-readable medium according to embodiments described herein and, for example, support circuits. To facilitate control of the charged particle beam device, the CPU may be one of any form of general purpose computer processor that can be used in an industrial setting for controlling various components and sub-processors. The computer-readable medium is coupled to the CPU. The computer readable medium or memory may be one or more readily available memory devices such as random access memory, read only memory, floppy disk, hard disk, or any other form of digital storage either local or remote. The support circuits may be coupled to the CPU for supporting the processor in a conventional manner. These circuits include cache, power supplies, clock circuits, input/output circuitry and related subsystems, and the like. Instructions for imaging a sample and/or instructions for calibrating the charged particle beam device are generally stored in the computer-readable medium as a software routine typically known as a recipe. The software routine may also be stored and/or executed by a second CPU that is remotely located from the hardware being controlled by the CPU. The software routine, when executed by the CPU, transforms the general purpose computer into a specific purpose computer (controller) that controls the charged particle beam device, and can provide for imaging a sample and/or calibrating the charged particle beam device according to any of the embodiments of the present disclosure. Although the method of the present disclosure is discussed as being implemented as a software routine, some of the method operations that are disclosed therein may be performed in hardware as well as by the software controller. As such, the embodiments may be implemented in software as executed upon a computer system, and hardware as an application specific integrated circuit or other type of hardware implementation, or a combination of software and hardware. The controller may execute or perform a method of imaging a sample according to embodiments of the present disclosure and/or a method of calibrating a charged particle beam device according to embodiments described herein.

According to embodiments described herein, the methods of the present disclosure can be conducted using computer programs, software, computer software products and the interrelated controllers, which can have a CPU, a computer readable medium or memory, a user interface, and input and output devices being in communication with the corresponding components of the apparatus.

Methods described herein allow for calibrating a charged particle beam device, e.g. a scanning electron microscope, and/or imaging a sample using the charged particle beam device. Methods described herein provide a high or predetermined fidelity of measurement. In particular, methods allow for imaging a surface region and/or performing measurement with a predetermined measurement accuracy, wherein the surface region can be positioned at an unknown distance from the objective lens. In particular, embodiments can provide a correction of a scan deflection or of a field of view to maintain a specification of nm/pixel in image scans at different focusing strengths. Methods of the present disclosure can allow for accurate measurements over a large defocus range, particularly over a range of focusing distances spanning hundreds of micrometers. Embodiments described herein can increase the throughput of metrology, sample review and/or sample inspection. Embodiments can provide a correction of a scan rotation, particularly for increasing a consistency of measurements in surface regions positioned at different levels relative to the objective lens. Methods described herein can provide an enhanced accuracy for critical dimension measurement in LV-SEMs, particularly for samples which are large in area and/or are not planar and/or are positioned on a non-planar stage and/or are electrically floating (cannot be brought to a certain electric potential).

Methods according to embodiments described herein may be used in process control, e.g. in the production of flat panels, displays, OLED devices such as OLED screens, TFT based substrates and other samples including a plurality of electronic or optoelectronic devices formed thereon. Process control may include regular monitoring, imaging and/or measurements of certain critical dimensions as well as defect review.

While the foregoing is directed to some embodiments, other and further embodiments may be devised without departing from the basic scope thereof, and the scope thereof is determined by the claims that follow.

The invention claimed is:

1. A method of imaging a sample with a charged particle beam device, comprising:
  determining a first focusing strength of an objective lens of the charged particle beam device, the first focusing strength being adapted to focus a charged particle beam on a first surface region of the sample;
  determining a first focal subrange of a plurality of focal subranges such that the first focusing strength is within the first focal subrange, wherein the plurality of focal subranges and a set of values of a calibration parameter for the plurality of focal subranges are predetermined;
  determining a first value of the set of values of the calibration parameter for the first focal subrange; and
  imaging the first surface region with the first value wherein the calibration parameter is a deflector parameter.

2. The method of claim 1, further comprising:
  adjusting a scan rotation parameter of the charged particle beam device based on the first focusing strength and based on a predetermined relation between a focusing strength and a scan rotation.

3. The method of claim 1, wherein the first focusing strength is determined by a variable focus autofocusing process.

4. The method of claim 3, wherein the variable focus autofocusing process comprises imaging the first surface region with varying focusing strengths of the objective lens and analyzing an image sharpness of obtained images.

5. The method of claim 1, wherein imaging the first surface region comprises:
  acquiring a first image of the first surface region with the first value; and
wherein the method further comprises:
  measuring a dimension of a first object in the first image.

6. The method of claim 1, wherein the set of values comprises at least one of a set of deflector current values and a set of deflector voltage values.

7. The method of claim 1, wherein the charged particle beam is provided with a landing energy of 5 keV or less.

8. The method of claim 1, wherein the charged particle beam device is configured for imaging a sample, the sample comprising a large-area substrate for display manufacturing having a surface area of 1 m$^2$ or more.

9. A method of calibrating a charged particle beam device, comprising:
  performing first measurements by performing a first measurement of a calibration object for each of a first plurality of focusing strengths;
  determining measurement errors by determining a measurement error for each of the first plurality of focusing strengths based on the first measurements;
  determining a plurality of focal subranges based on the measurement errors and a measurement accuracy;
  performing second measurements by performing a second measurement of the calibration object for each of the plurality of focal subranges; and
  determining a set of values of a calibration parameter for the plurality of focal subranges based on the second measurements wherein the calibration parameter is a deflector parameter.

10. The method of claim 9, wherein calibrating further comprises:
  determining orientation mismatches by determining an orientation mismatch of a scan rotation of the charged particle beam device with respect to the calibration object for each of a second plurality of focusing strengths; and
  determining a relation between a focusing strength and a scan rotation based on the orientation mismatches and the second plurality of focusing strengths.

11. The method of claim 9, wherein at least one of performing the first measurement and performing the second measurement comprises bringing the calibration object into a focus of a charged particle beam using a variable distance autofocusing process.

12. The method of claim 11, wherein the variable distance autofocusing process comprises:
  imaging the calibration object at varying distances from an objective lens and analyzing an image sharpness of obtained images.

13. The method of claim 9, wherein each of the plurality of focal subranges has a calibration focusing strength for performing the second measurement.

14. The method of claim 9, wherein a charged particle beam of the charged particle beam device is provided with a landing energy of 5 keV or less.

15. The method of claim 9, wherein the charged particle beam device is configured for imaging a sample, the sample comprising a large-area substrate for display manufacturing having a surface area of 1 m$^2$ or more.

16. The method of claim 9, wherein the set of values comprises at least one of a set of deflector current values and a set of deflector voltage values.

17. A charged particle beam device for imaging a sample, comprising:
  a stage for arranging the sample to be imaged;
  an objective lens configured to focus a charged particle beam propagating along an optical axis; and
  a computer-readable medium containing a program for imaging the sample, which, when executed by a processor, performs a method of imaging a sample, comprising:
  determining a first focusing strength of an objective lens of the charged particle beam device, the first focusing strength being adapted to focus a charged particle beam on a first surface region of the sample;
  determining a first focal subrange of a plurality of focal subranges such that the first focusing strength is within the first focal subrange, wherein the plurality of focal subranges and a set of values of a calibration parameter for the plurality of focal subranges are predetermined;

determining a first value of the set of values of the calibration parameter for the first focal subrange; and imaging the first surface region with the first value wherein the calibration parameter is a deflector parameter.

18. The charged particle beam device of claim 17, wherein the computer-readable medium contains a further program for calibrating the charged particle beam device, which, when executed by the processor, performs a method of calibrating the charged particle beam device, comprising:

performing first measurements by performing a first measurement of a calibration object for each of a first plurality of focusing strengths;

determining measurement errors by determining a measurement error for each of the first plurality of focusing strengths based on the first measurements;

determining the plurality of focal subranges based on the measurement errors and a measurement accuracy;

performing second measurements by performing a second measurement of the calibration object for each of the plurality of focal subranges; and determining the set of values of the calibration parameter for the plurality of focal subranges based on the second measurements.

19. A method of calibrating a charged particle beam device, comprising:

performing first measurements by performing a first measurement of a calibration object for each of a first plurality of focusing strengths;

determining measurement errors by determining a measurement error for each of the first plurality of focusing strengths based on the first measurements;

determining a plurality of focal subranges based on the measurement errors and a measurement accuracy;

performing second measurements by performing a second measurement of the calibration object for each of the plurality of focal subranges; and determining a set of values of a calibration parameter for the plurality of focal subranges based on the second measurements, wherein the calibration parameter is a deflector parameter and the set of values comprises at least one of a set of deflector current values and a set of deflector voltage values.

* * * * *